United States Patent
Lo et al.

(10) Patent No.: US 8,481,967 B2
(45) Date of Patent: Jul. 9, 2013

(54) METHOD OF PROCESSING OBJECTS BY FOCUSED ION BEAM SYSTEM AND CARRIER USED THEREWITH

(75) Inventors: Shen-Chuan Lo, Hsinchu (TW); Ming-Wei Lai, Hsinchu (TW); Shi-Ri Lee, Hsinchu (TW); Li-Jiaun Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 434 days.

(21) Appl. No.: 12/481,772

(22) Filed: Jun. 10, 2009

(65) Prior Publication Data
US 2010/0163752 A1   Jul. 1, 2010

(30) Foreign Application Priority Data
Dec. 29, 2008 (TW) ............................... 97151170 A

(51) Int. Cl.
*G21K 5/00* (2006.01)
(52) U.S. Cl.
USPC .................. 250/440.11; 250/491.1; 250/492.3
(58) Field of Classification Search
USPC ............... 250/440.11, 441.11, 442.11, 492.1, 250/492.3, 491.1
See application file for complete search history.

(56) References Cited

U.S. PATENT DOCUMENTS

| | | | |
|---|---|---|---|
| 4,532,426 A * | 7/1985 | Reeds ...................... | 250/442.11 |
| 5,270,552 A | 12/1993 | Ohnishi et al. | |
| 5,515,079 A | 5/1996 | Hauck | |
| 6,188,068 B1 | 2/2001 | Shaapur et al. | |
| 6,791,669 B2 | 9/2004 | Poon | |
| 6,870,161 B2 | 3/2005 | Adachi et al. | |
| 7,315,023 B2 | 1/2008 | Moore | |
| 2003/0127605 A1* | 7/2003 | Kondo ....................... | 250/492.2 |
| 2008/0079920 A1* | 4/2008 | Hommen et al. ............... | 355/55 |
| 2010/0264330 A1* | 10/2010 | Mizuochi et al. ........ | 250/442.11 |
| 2010/0305747 A1* | 12/2010 | Agorio et al. ................. | 700/213 |

* cited by examiner

*Primary Examiner* — Nicole Ippolito
(74) *Attorney, Agent, or Firm* — Rabin & Berdo, P.C.

(57) ABSTRACT

A method of processing objects by a FIB (Focused Ion Beam) system and a carrier used therewith are provided. The carrier includes a carrying member and a processing portion having an object disposed thereon. Before the carrier is disposed into the FIB system, the carrying member is set to be flush in height with the processing portion having the object disposed thereon. After an eucentric height adjustment inside the FIB system, both the carrying member and the processing portion are in a same plane with the eucentric point of the system. Therefore, after the object on the processing portion is processed, a processed object or a processed block of the object can be moved to the carrying member without performing further eucentric height adjustment with respect to the carrying member.

18 Claims, 3 Drawing Sheets

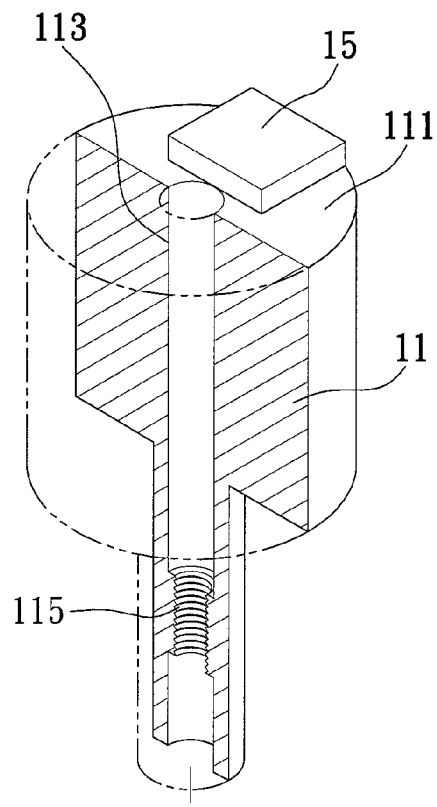
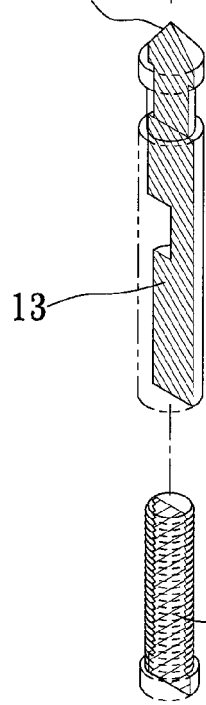
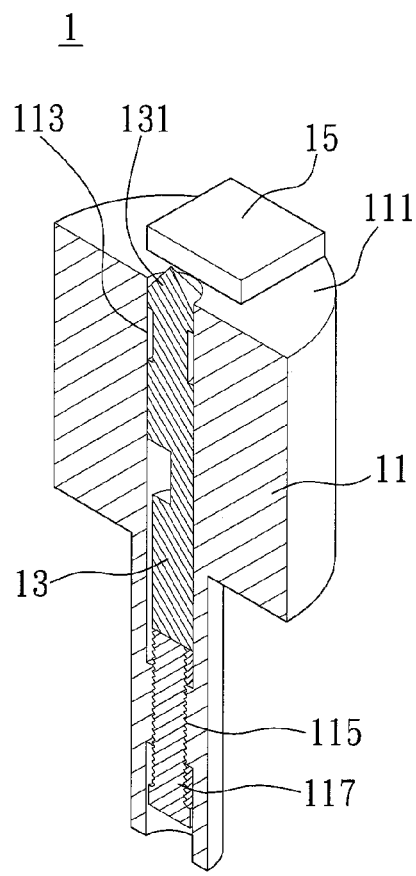
FIG. 1a
FIG. 1b

METHOD OF PROCESSING OBJECTS BY FOCUSED ION BEAM SYSTEM AND CARRIER USED THEREWITH

BACKGROUND OF THE INVENTION

1. Field of the Invention

The present invention relates generally to object processing techniques, and more particularly to a method of processing objects by a focused ion beam system to fabricate samples and a carrier applied to the method.

2. Description of Related Art

A focused ion beam (FIB) system uses an electromagnetic lens to focus an ion beam to an extra small spot so as to perform processing such as cutting and shaping. Since such a technique allows precise positioning, less material limitation, and minor specimen destruction, it can be widely applied to the fields of analysis sample preparation, IC replacement and repair, and micro/nanostructure fabrication after combining with a micro-manipulation technique.

For example, a method disclosed by U.S. Pat. No. 5,270,552 comprises the steps of: processing a desired portion of an object by an FIB system so as to form a sample, fixing the sample to a probe attached to a manipulator through a thin deposition film, and moving the probe to a desired position.

The above-mentioned patent describes the most common method of moving samples in FIB processing. However, in practice, a height difference often exists between the position of an analysis carrier for carrying a sample and the position of an original specimen (object) processing area. Accordingly, the eucentric height needs to be adjusted again with respect to the position of the carrier. Such a drawback is not solved in the patent.

According to the practical procedure, the eucentric height needs to be adjusted with respect to the processing position to process a specimen in a FIB machine, which is the first eucentric height adjustment. Then, when the sample that is lifted from the specimen is to be fixed to a carrier, the eucentric height is adjusted again with respect to the carrier, which is the second eucentric height adjustment. In other words, another eucentric height adjustment is required if a height difference exists between the sample and the carrier. In addition, in order to prevent the probe of a manipulator from impacting the stage, column or other internal devices inside FIB system, the probe usually needs to be placed far from the processing area and moved back after the eucentric height adjustment is completed. Therefore, the second eucentric height adjustment increases the processing time consumption, the operation complexity, and the security risk of the sample.

SUMMARY OF THE INVENTION

In view of the above drawbacks, the present invention provides an object processing method applicable to a FIB (Focused Ion Beam) system and a carrier used therewith so as to save the steps from a second eucentric height adjustment, thereby simplifying the preparation process and improving the processing efficiency.

Additionally, the present invention provides an object processing method applicable to a FIB system and a carrier used therewith so as to reduce the risk and achieve cost-efficiency.

In summary, the present invention provides an object processing method applicable to a FIB (Focused Ion Beam) system with a carrier, wherein the carrier comprises a processing portion having an object disposed thereon and a carrying member, the object processing method comprising the following steps: setting the top of the carrying member to be flush with the processing portion having the object disposed thereon; processing the object on the processing portion to be a processed object or to form a processed block; and moving the processed object or the processed block on the object to the carrying member.

The FIB system can be used to fabricate a sample for TEM (Transmission Electron Microscope) analysis, IC repair, or micro/nanostructure assembly. In an embodiment, the object is a specimen to be analyzed, which is processed through the processing step so as to form a sample for TEM analysis and then moved to the top of the carrying member for subsequent milling.

In another embodiment, the object is an element of a specific circuit structure, which is processed through the processing step so as to form a repairing material for integrated circuit repairing. The integrated circuit is provided on the top of the carrying member and the repairing material is moved to a specific position on the integrated circuit and bonded thereto.

In a further embodiment, the object is a bulk material which contains specific ingredients or specific characteristics. The object processing steps include processing the object so as to form a modeling object at a micron or a nanometer scale. A structure to be assembled is disposed on the top of the carrying member, and the modeling object is moved on to the structure for implementing a micro/nanostructure assembly.

The present invention also provides a carrier applied to the above-described object processing method and a FIB system. The carrier comprises a carrying member and a carrying base, wherein the carrying base comprises: a processing portion located on an upper surface of the carrying base, allowing an object to be disposed thereon; and a receiving portion for receiving the carrying member. The carrying member is a supporting medium for disposing a processed object or a processed block of the object thereon. In addition, the carrying member can have a carrying body disposed on the top thereof, which serves extra functions.

In an embodiment, the receiving portion is a through hole penetrating the carrying base to form a specific depth and connected to a positioning portion. The positioning portion can be either a screw hole or an opening.

The carrier further comprises a lift mechanism for lifting the carrying member. The lift mechanism is a screw, a bolt, a spring, a sliding block, or a stepper motor.

Compared with the prior art, the present invention spares the object processing steps from a second eucentric height adjustment required in the prior art due to a height difference between the processed object to be moved and the carrying base, thereby simplifying the operation, improving the processing efficiency, and reducing the risk.

BRIEF DESCRIPTION OF DRAWINGS

FIGS. 1a and 1b show a carrier according to a first embodiment of the present invention, wherein FIG. 1a is an exploded view of the carrier and FIG. 1b is an assembly view of the carrier;

DETAILED DESCRIPTION OF PREFERRED EMBODIMENTS

Figure 2:
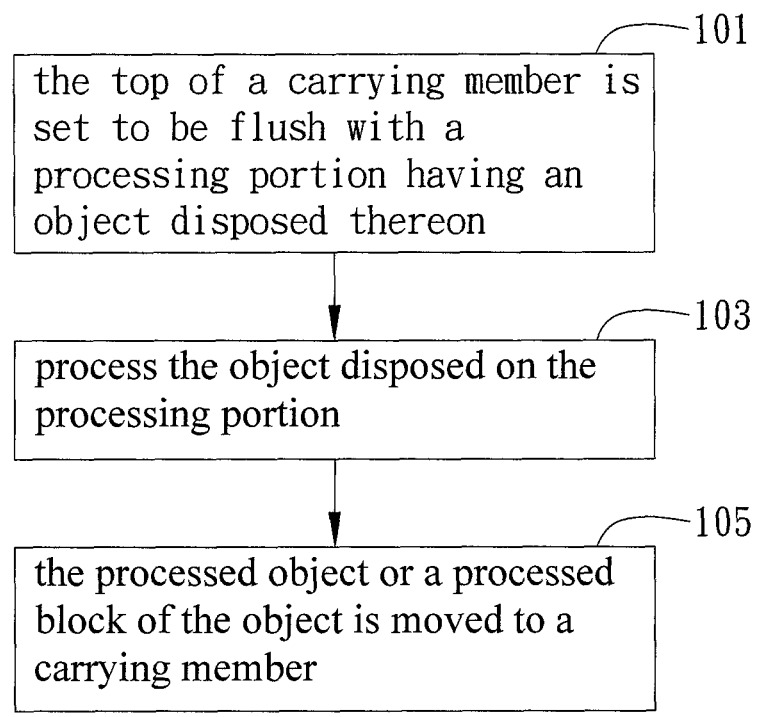
FIG. 2 is a flow diagram showing a method of processing objects according to the first embodiment of the present invention.

The following illustrative embodiments are provided to illustrate the disclosure of the present invention, these and other advantages and effects can be understood by those skilled in the art apparently after reading the disclosure of this specification. For simplification and clarification of the technical features, the main structures directly relevant to the present invention have been shown as the others have been omitted.

First Embodiment

FIGS. 1a and 1b show a carrier according to a first embodiment of the present invention, wherein the carrier is used in the method of processing objects according to the present invention. In the present embodiment, the carrier is used for fabricating a three-dimensional TEM (Transmission Electron Microscope) sample; the example is however not intended to limit the present invention. Further, in order to make the characteristics and structures of the present invention more clear, only structures related to the present invention are shown in the drawings.

FIG. 1a is an exploded view of the carrier and FIG. 1b is an assembly view of the carrier.

Referring to FIGS. 1a and 1b, the method of processing objects according to the present embodiment is applicable to a FIB system with a carrier 1 as shown in FIGS. 1a and 1b. The carrier 1 comprises a carrying base 11 and a carrying member 13 integrated with the carrying base 11. After a processed object is moved to the carrying member 13 and milled, the carrying member 13 is directly disposed on a TEM analysis carrier and than loaded into TEM for analysis. The carrying base 11 comprises a processing portion 11 having an object 15 disposed thereon, a receiving portion 113 for receiving the carrying member 13, a positioning portion 115 connected to the receiving portion 113, and a lift mechanism 117 for lifting the carrying member 13 vertically.

In the present embodiment, the carrying base 11 is a cylindrical carrying base for a FIB specimen. The processing portion 111 is located on an upper surface of the carrying base 11. The receiving portion 113 is a through hole penetrating the carrying base 11 to form a specific depth. For example, the receiving portion 113 is a cylindrical hole formed in the center of the carrying base 11, but it is not limited thereto. The positioning portion 115 can be a screw hole below the receiving portion 113. The lift mechanism 117 can be a screw corresponding to the positioning portion 115, which penetrates through the positioning portion 115 and connects the carrying member 13. Apparently, the positioning portion 115 and the lift mechanism 117 can be any other equivalent combinations or elements capable of performing a lift adjustment.

In the present embodiment, the carrying member 13 can be a TEM sample supporting base. The carrying member 13 comprises a carrying portion 131 located at one end thereof while the lift mechanism 117 connected to the other end. The carrying portion 131 is of a tip shape in one example. The height of the carrying member 13 can be adjusted to allow the height of the carrying portion 131 protruding above the receiving portion 113 to be equal to the height of the processing portion 111 having the object 15 disposed thereon. That is, the tip of the carrying portion 131 is flush with the upper surface of the object 15. The object 15, such as a specimen, is to be analyzed.

FIG. 2 shows a method of processing objects according to the first embodiment. As shown in FIG. 2, in step 101, the top of the carrying member 13 is set to be flush with the processing portion 111 having the object 15 disposed thereon. Next, in step 103, the object 15 on the processing portion 111 is processed. Finally, in step 105, the processed object 15 or a processed block of the object 15 is moved to the carrying member 13.

The step 103 further comprises a step of adjusting the position of the carrier 1 inside the FIB system so as to locate the object 15 to the eucentric height of the FIB system before processing the object 15 on the processing portion 111.

Additionally, in step 101, after the object 15 is disposed on the processing portion 111, the carrying member 13 is lifted by the lift mechanism 117 such that the top of the carrying member 13 is flush with the surface of the object 15. That is, the lift mechanism 117 adjusts the level of the carrying member 13 until the height of the carrying portion 131 protruding above the receiving portion 113 is equal to the height of the object 15 on the processing portion 111. To determine whether the top of the carrying member 13 is flush with the processing portion 111 having the object 15 disposed thereon, an optical microscope (OM) (not shown) can be used for performing an auxiliary adjustment.

The FIB system of the present embodiment can be a single beam or dual beam focused ion beam system. In step 103, after a eucentric height adjustment is performed by using a feature point of the object 15 as a reference point, the object 15 is processed by using the ion beam so as to form a prototype sample for TEM analysis. In step 103, milling process can be enhanced by reactive gas, so as to shorten the required time.

Since the processing principle and technique are well known in the art, detailed description thereof is omitted herein.

In step 105, the prototype sample is moved to the carrying member 13. The processed object or the processed block of the object lifted off by manipulator can directly depose to the carrying member 13 that has located at the eucentric point of the FIB system by only planar shifting the stage based on it's coordination since the top of the carrying member 13 is approximately flush with the processing portion 111 having the object 15 disposed thereon. Even if some error exists, it can be compensated through an adjustment of the position of the ion beam or other built-in auxiliary control functions of the system. Therefore, in practice, the prototype sample is captured by a manipulator from the processing portion 111 and directly moved and fixed to the carrying member 13 for subsequent fine milling without the need of a second eucentric height adjustment.

In brief, the carrier 1 of the present embodiment is suitable for fabricating TEM prototype samples, such as three-dimensional rod-shaped samples; the example is however not intended to limit the scope of present invention. In the sample moving process, the sample and the probe of a manipulator can be combined by a coating film, static electric force, magnetic force, pressure force, and so on. Instead of using a screw, a bolt, a spring, a sliding block, or a stepper motor can be used to control the height of the carrying member.

Second Embodiment

Figure 3:
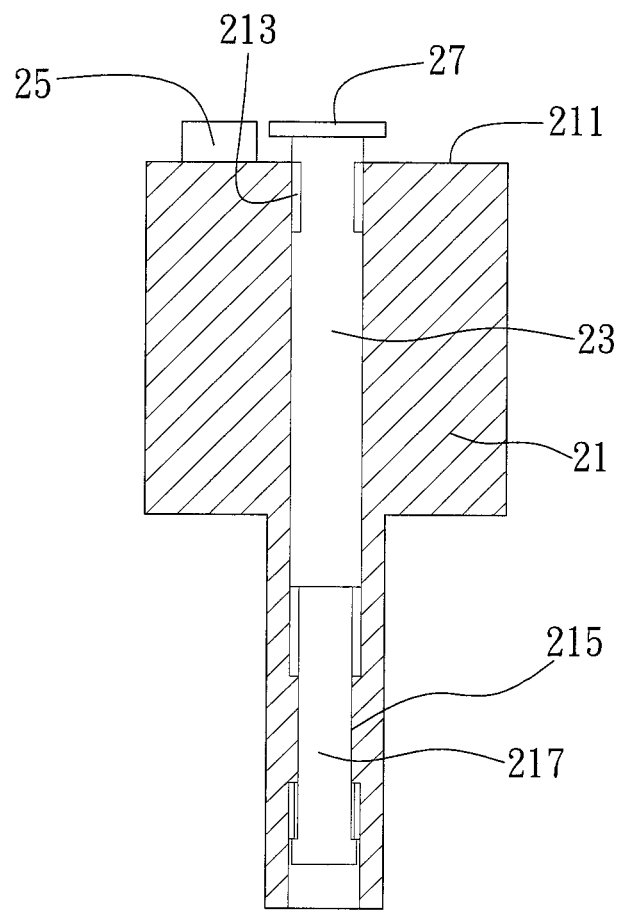
FIG. 3 is an assembly view of the carrier according to a second embodiment of the present invention.

FIG. 3 is an assembly view of a carrier according to a second embodiment of the present invention. As shown in the drawing, the carrier 2 comprises a carrying base 21 and a carrying member 23 integrated with the carrying base 21. The carrying base 21 comprises: a processing portion 211 having an object 25 disposed thereon, a receiving portion 213 for receiving the carrying member 23, a positioning portion 215 connected to the receiving portion 213, and a lift mechanism 217 for lifting the carrying member 23 vertically.

Unlike the first embodiment, the top of the carrying member 23 of the present embodiment has a carrying body 27 disposed thereon. In addition, the carrying body 27 is an integrated circuit to be repaired or a micro/nanostructure to be assembled, but it is not limited thereto.

In an embodiment, the carrying body 27 is an integrated circuit to be repaired, and the object 25 is a bulk material which contains specific ingredients or an element for a specific circuit structure. After the object 25 on the processing portion 211 is processed to form a material suitable for repairing the integrated circuit provided on the top of the carrying member 23, suitable said repairing material is moved to a specific position on the integrated circuit and bonded thereto.

In another embodiment, the carrying body 27 is a micro/nanostructure to be assembled and the object 25 is a bulk material which contains specific ingredients or specific characteristics. The object 25 on the processing portion 211 is processed to form a modeling object at a micron or nanometer scale and then moved to the micro/nanostructure to be assembled on the top of the carrying member 23 for a micro/nanostructure assembly.

Compared with the prior art, the present invention relates to the development of a carrier applied in FIB systems and a method of processing objects. The carrier comprises a carrying member, a processing portion having an object disposed thereon and a lift mechanism for adjusting the height of the carrying member. In practice, the top of the carrying member is set to be flush with the processing portion having the object disposed thereon by the lift mechanism. Therefore, through a eucentric height adjustment of the FIB system before processing of the object, both the carrying member and the processing portion will be in a same plane with the eucentric point of the system, thereby saving the need of a second eucentric height adjustment required in the prior art.

The above-described descriptions of the detailed embodiments are only to illustrate the implementation according to the present invention, but are not to limit the scope of the present invention. Accordingly, all the modifications and variations accomplished by those with ordinary skills in the art should fall within the scope of present invention defined by the appended claims.

What is claimed is:

1. A method of processing objects applicable to a FIB (Focused Ion Beam) system with a carrier comprising a processing portion having an object disposed thereon and a carrying member, the method comprising the steps of:
    regulating a height of the carrying member according to a height of the object;
    setting a top of the carrying member to be flush with an upper surface of the object;
    processing with an ion beam the object disposed on the processing portion; and
    moving the processed object or a processed block of the object to the carrying member.

2. The method of claim 1, wherein the step of setting the top of the carrying member to be flush with the upper surface of the object further comprises:
    lifting the carrying member by a lift mechanism to allow the top of the carrying member to be flush with the upper surface of the object.

3. The method of claim 1, wherein the step of processing with the ion beam the object on the processing portion further comprises:
    adjusting the carrier position for making the object to the eucentric height of the FIB system.

4. The method of claim 1, wherein the step of setting the top of the carrying member to be flush with the upper surface of the object further comprises:
    performing an auxiliary adjustment with an optical microscope (OM).

5. The method of claim 1, wherein the step of processing with the ion beam the object on the processing portion further comprises:
    processing the object so as to form a sample for a transmission electron microscope (TEM) analysis.

6. The method of claim 5, wherein the step of moving the processed object or a processed block of the object to the carrying member further comprises:
    moving the processed object to the carrying member and performing subsequent milling.

7. The method of claim 1, wherein the step of processing with the ion beam the object on the processing portion further comprises:
    processing the object so as to form an integrated circuit repairing material.

8. The method of claim 7, wherein the integrated circuit is located on the top of the carrying member, and the step of moving the processed object or a processed block of the object to the carrying member further comprises:
    moving the repairing material to a location on the integrated circuit and bonding the repairing material thereto.

9. The method of claim 1, wherein the step of processing with the ion beam the object on the processing portion further comprises:
    processing the object so as to form a modeling object for a micro/nanostructure assembly.

10. The method of claim 9, wherein a structure to be assembled is located on the top of the carrying member, and the step of moving the processed object or a processed block of the object to the carrying member further comprises moving the modeling object to the structure to be assembled to perform the micro/nanostructure assembly.

11. A carrier applied to a FIB (Focused Ion Beam) system that emits an ion beam, the carrier comprising:
    a carrying member; and
    a carrying base comprising:
        a processing portion located on an upper surface of the carrying base; and
        a receiving portion for receiving the carrying member,
    wherein the carrying member is adjustable according to a height of an object disposed on the processing portion, and
    wherein the carrying member is configured so that a top of the carrying member is setable to be flush with an upper surface of the object, and
    further wherein the object disposed on the processing portion is processed with the ion beam.

12. The carrier of claim 11, wherein the carrying member is a supporting medium for disposing a processed object or a processed block of the object thereon.

13. The carrier of claim 11, wherein the receiving portion is a through hole penetrating the carrying base to form a depth.

14. The carrier of claim 11, wherein the carrying base comprises a positioning portion connected to the receiving portion.

15. The carrier of claim 14, wherein the positioning portion is a screw hole or an opening.

16. The carrier of claim 11, wherein the carrier further comprises a lift mechanism for lifting the carrying member vertically.

17. The carrier of claim 16, wherein the lift mechanism is a screw, a bolt, a spring, a sliding block, or a stepper motor.

18. The carrier of claim 11, wherein the top of the carrying member further comprises a carrying body, the carrying body is an integrated circuit to be repaired or a micro/nanostructure to be assembled.

* * * * *